US008743632B2

(12) United States Patent
Kim et al.

(10) Patent No.: US 8,743,632 B2
(45) Date of Patent: Jun. 3, 2014

(54) NONVOLATILE MEMORY DEVICE, OPERATING METHOD THEREOF, AND DATA STORAGE DEVICE HAVING THE SAME

(71) Applicant: SK hynix Inc., Icheon-si (KR)

(72) Inventors: Byung Ryul Kim, Icheon-si (KR); Cheul Hee Koo, Icheon-si (KR); Duck Ju Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,448

(22) Filed: Dec. 11, 2012

(65) Prior Publication Data

US 2014/0010026 A1   Jan. 9, 2014

(30) Foreign Application Priority Data

Jul. 5, 2012   (KR) .................. 10-2012-0073409

(51) Int. Cl.
*G11C 5/14*       (2006.01)
*G11C 7/00*       (2006.01)
*G11C 13/00*      (2006.01)
*G11C 8/08*       (2006.01)

(52) U.S. Cl.
CPC .............. *G11C 5/147* (2013.01); *G11C 13/004* (2013.01); *G11C 13/0069* (2013.01); *G11C 7/00* (2013.01); *G11C 8/08* (2013.01)
USPC ............ 365/189.16; 365/189.09; 365/189.07; 365/148; 365/158; 365/163

(58) Field of Classification Search
CPC .. G11C 5/147; G11C 13/004; G11C 13/0069; G11C 13/0002; G11C 13/0004; G11C 5/14; G11C 7/00; G11C 8/08
USPC ............... 365/148, 158, 163, 189.07, 189.09, 365/189.16
See application file for complete search history.

(56) References Cited

U.S. PATENT DOCUMENTS

| | | | | |
|---|---|---|---|---|
| 2007/0211537 | A1* | 9/2007 | Park et al. ................ | 365/185.22 |
| 2011/0194353 | A1* | 8/2011 | Hwang et al. ............ | 365/185.19 |
| 2012/0106247 | A1* | 5/2012 | Shin ......................... | 365/185.03 |
| 2013/0016558 | A1* | 1/2013 | Ahn et al. ................. | 365/185.03 |
| 2013/0107653 | A1* | 5/2013 | Kwak ......................... | 365/218 |

FOREIGN PATENT DOCUMENTS

| | | |
|---|---|---|
| KR | 1020050106277 A | 11/2005 |
| KR | 1020090005550 A | 1/2009 |

* cited by examiner

*Primary Examiner* — Ly D Pham
(74) *Attorney, Agent, or Firm* — William Park & Associates Patent Ltd.

(57) ABSTRACT

A nonvolatile memory device including a plurality of memory cells arranged at a region where a word line and a bit line cross each other, a voltage generator configured to generate a program voltage to apply to the word line by increasing the program voltage by an increment whenever a program loop is repeated, a current sensing check unit configured to compare a number of failed memory cells among the memory cells to first and second reference values, and a control logic configured to control the voltage generator to change the increment according to the comparison result of the current sensing check unit.

23 Claims, 11 Drawing Sheets

NONVOLATILE MEMORY DEVICE, OPERATING METHOD THEREOF, AND DATA STORAGE DEVICE HAVING THE SAME

CROSS-REFERENCES TO RELATED APPLICATION

The present application claims priority under 35 U.S.C. §119(a) to Korean application number 10-2012-0073409, filed on Jul. 5, 2012, in the Korean Intellectual Property Office, which is incorporated herein by reference in its entirety.

BACKGROUND

1. Technical Field

The present invention generally relates to a semiconductor memory device, and more particularly, to a nonvolatile memory device, an operating method thereof, and a data storage device having the same.

2. Related Art

In general, a semiconductor memory device is classified into a volatile memory device and a nonvolatile memory device. The volatile memory device loses data stored therein when power supply is cut off, but the nonvolatile memory device maintains data stored therein even though power supply is cut off. The nonvolatile memory device may include various types of memory cells.

The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like, depending on the structure of memory cells.

Among the nonvolatile memory devices, the flash memory device is roughly divided into a NOR flash memory device and a NAND flash memory device, depending on the connection state between memory cells and a bit line. The NOR flash memory device has a structure in which two or more memory cell transistors are connected in parallel to one bit line. Therefore, the NOR flash memory device has an excellent random access time characteristic. On the other hand, the NAND flash memory device has a structure in which two or more memory cell transistors are connected in series to one bit line. Such a structure is referred to as a cell string, and one bit line contact is required per one cell string. Therefore, the NAND flash memory device has an excellent characteristic in terms of integration degree.

The nonvolatile memory device may perform a program operation through a plurality of operation loops. Such a program loop includes a program voltage application operation of applying a program voltage to a selected memory cell and a program verify operation of verifying whether or not the selected memory cell is programmed to have a desired threshold voltage. When it is determined through the program verify operation that the program operation is passed, the program operation is normally completed. However, when it is determined through the program verify operation that the program operation is failed, the program loop is repetitively performed until the program operation for the selected memory cell is passed. Whenever the program operation loop is repeated, the program voltage applied to the selected memory cell increases.

SUMMARY

A nonvolatile memory device of which the program time is reduced, an operating method thereof, and a data storage device having the same are described herein.

In an embodiment, a nonvolatile memory device includes: a plurality of memory cells arranged at a region where a word line and a bit line cross each other; a voltage generator configured to generate a program voltage to apply to the word line by increasing the program voltage by an increment whenever a program loop is repeated; a current sensing check unit configured to compare a number of failed memory cells among the memory cells to first and second reference values; and a control logic configured to control the voltage generator to change the increment according to the comparison result of the current sensing check unit.

In an embodiment, an operating method of a nonvolatile memory device includes the steps of: primarily applying a first program voltage, which is increased by an increment from a program voltage applied during a previous program loop, to memory cells; when one or more of the memory cells receiving the program voltage are failed, comparing a number of failed memory cells to first and second reference values, respectively; generating a second program voltage by changing the increment based on the comparison result; and secondarily applying the second program voltage to the memory cells.

In an embodiment, a data storage device includes: a nonvolatile memory device; and a controller configured to control the nonvolatile memory device, wherein the nonvolatile memory device includes: a plurality of memory cells arranged at a region where a word line and a bit line cross each other; a voltage generator configured to generate a program voltage to apply to the word lines by increasing the program voltage by an increment whenever a program loop is repeated; a current sensing check unit configured to compare a number of failed memory cells among the memory cells to first and second reference values; and a control logic configured to control the voltage generator to change the increment according to the comparison result of the current sensing check unit.

BRIEF DESCRIPTION OF THE DRAWINGS

Features, aspects, and embodiments are described in conjunction with the attached drawings, in which.

DETAILED DESCRIPTION

Hereinafter, a nonvolatile memory device, an operating method thereof, and a data storage device having the same according to the various embodiments will be described below with reference to the accompanying drawings through the various embodiments.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
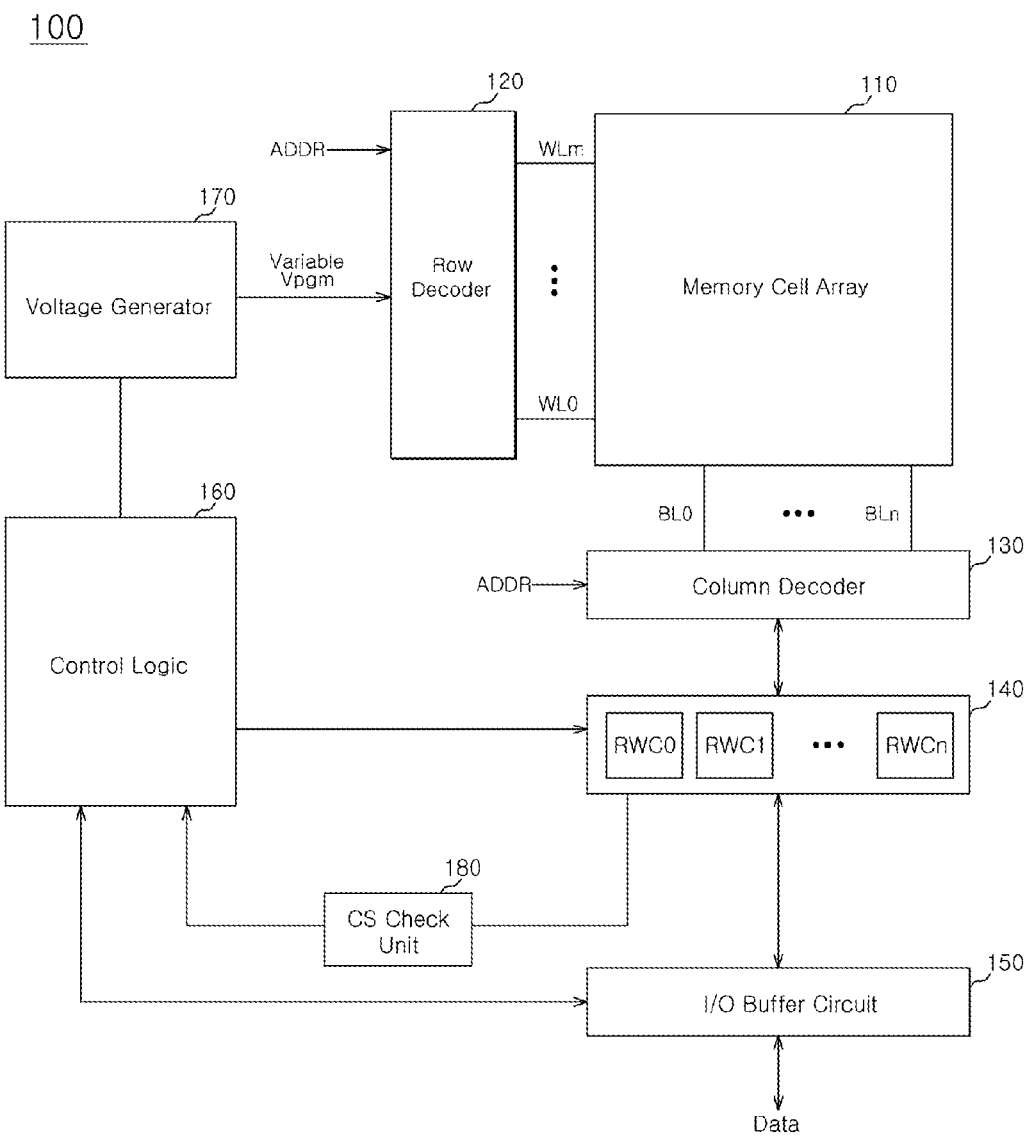
FIG. 1 is a block diagram illustrating a nonvolatile memory device according to an embodiment.

FIG. 1 is a block diagram illustrating a nonvolatile memory device according to an embodiment. Referring to FIG. 1, the nonvolatile memory device 100 may include a memory cell array 110, a row decoder 120, a column decoder 130, a data read/write circuit 140, an input/output (I/O) buffer circuit 150, a control logic 160, a voltage generator 170, and a current sensing check unit 180.

The memory cell array 110 may include a plurality of memory cells arranged at the respective intersections between bit lines BL0 to BLn and word lines WL0 to WLm. Each of the memory cells may store one-bit data. Such a memory cell is referred to as a single level cell (SLC). The SLC is programmed in such a manner as to have a threshold voltage corresponding to an erase state and one program state. As another example, each of the memory cells may store two or more-bit data. Such a memory cell is referred to as a multi-level cell (MLC). The MLC is programmed in such a manner as to have a threshold voltage corresponding to an erase state and any one of a plurality of program states. The memory cell array 110 may be implemented to have a single-layer array structure or multi-layer array structure. The single-layer array structure is referred to as a 2D array structure, and the multi-layer array structure is referred to as a 3D array structure.

The row decoder 120 may operate according to the control of the control logic 160. The row decoder 120 is connected to the memory cell array 110 through the plurality of word lines WL0 to WLm. The row decoder 120 may be configured to decode an address ADDR inputted from outside. The row decoder 120 may be configured to selectively drive the word lines WL0 to WLm according to the decoding result. For example, the row decoder 120 may provide a select voltage (program voltage) to a selected word line, and provide an unselect voltage (pass voltage) to an unselected word line during a program operation.

The column decoder 130 may operate according to the control of the control logic 160. The column decoder 130 is connected to the memory cell array 110 through the bit lines BL0 to BLn. The column decoder 130 may be configured to decode the address ADDR. The column decoder 130 may be configured to sequentially connect the bit lines BL0 to BLn to the data read/write circuit 140 by the predetermined unit according to the decoding result.

The data read/write circuit 140 may operate according to the control of the control logic 160. The data read/write circuit 140 may be configured to operate as a write driver or sense amplifier depending on an operation mode. For example, the data read/write circuit 140 may be configured to store data inputted through the I/O buffer circuit 150 in a memory cell of the memory cell array 110 during a program operation. For another example, the data read/write circuit 140 may be configured to output data read from a memory cell of the memory cell array 110 to the I/O buffer circuit 150 during a read operation.

The data read/write circuit 140 may include a plurality of data read/write circuits RWC0 to RWCn corresponding to the respective bit lines BL0 to BLn (or bit line pairs). For this reason, the bit lines BL0 to BLn (or bit line pairs) may be selected or controlled by the corresponding data read/write circuits RWC0 to RWCn, respectively.

The I/O buffer circuit 150 may be configured to receive data (i.e., Data) from an external device (for example, a memory controller, a memory interface, a host device or the like) or output data (i.e., Data) to the external device. For this operation, the I/O output buffer circuit 150 may include a data latch circuit (not illustrated) and an output driving circuit (not illustrated).

The control logic 160 may be configured to control overall operations of the nonvolatile memory device 100 in response to a control signal provided from the external device. For example, the control logic 160 may control read, program (or write), and erase operations of the nonvolatile memory device 100.

The voltage generator 170 may be configured to generate a voltage according to the control of the control logic 160. That is, the voltage generator 170 may be configured to generate a voltage required (i.e., Variable Vpgm (program voltage)) for a corresponding operation in response to a voltage generation control signal provided from the control logic 160.

The current sensing check unit 180 (i.e., CS Check Unit) may be configured to sense the magnitude of a pass/fail signal provided from the data read/write circuit 140. That is, the current sensing check unit 180 may be configured to compare a reference voltage to the magnitude of the pass/fail signal, and determine how many data read/write circuits are failed among the data read/write circuits RWC0 to RWCn, according to the comparison result. For example, the current sensing check unit 180 may be configured to provide information on whether the number of failed data read/write circuits is larger or smaller than a reference value, to the control logic 160. Hereafter, the operation of the current sensing check unit 180 will be referred to as a fail bit count operation.

In this embodiment, the control logic 160 may be configured to control a program operation according to the fail bit count operation result of the current sensing check unit 180. That is, the control logic 160 performs control to change a program voltage applied to a selected memory cell according to a fail bit number provided from the current sensing check unit 180. For example, the control logic 160 controls the voltage generator 170 to change a program voltage increment (step voltage or step pulse), which is increased at each program loop, according to the fail bit number. Hereafter, this method is defined as a variable step pulse program method.

For example, when the fail bit number is smaller than a first reference value, the control logic 160 controls a program voltage increment to decrease from a program voltage increment of the previous program loop. As another example, when the fail bit number is larger than a second reference value, the control logic 160 controls the program voltage increment to increase from the program voltage increment of the previous program loop. The variable step pulse program method will be described below in detail. When a selected memory cell is programmed according to the variable step pulse program method, the generation and application time of the program pulse may be reduced. Therefore, the operation speed of the nonvolatile memory device 100 may be improved.

Figure 2:
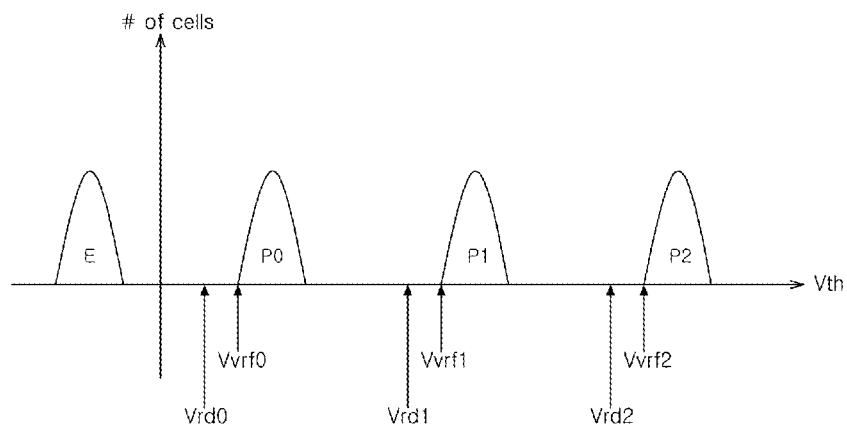
FIG. 2 is a diagram illustrating a threshold voltage distribution of memory cells according to an embodiment.
Figure 3:
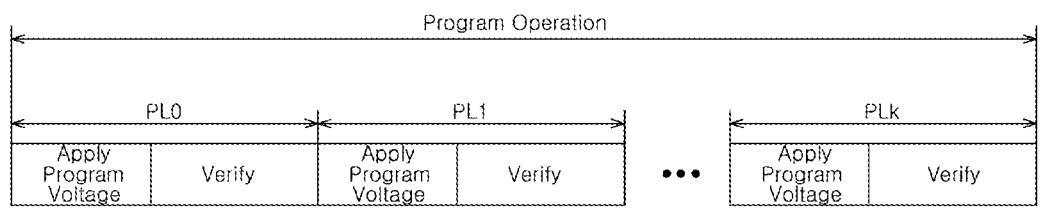
FIG. 3 is a diagram for explaining a program loop according to an embodiment.

FIG. 2 is a diagram illustrating a threshold voltage distribution of memory cells according to an embodiment. FIG. 3 is a diagram for explaining a program loop according to an embodiment. In FIG. 2, suppose that the memory cells forming the memory cell array 110 of FIG. 1 are MLCs to store two bits, for convenience of description. The MLC to store two-bit data is programmed to have an erase state E and one of a plurality of program states P0, P1, and P2, or erased. The y-axis displays the number of cells (i.e., # of cells) and the x-axis displays the Voltage threshold (i.e., Vth).

During a read operation, any one of select read voltages Vrd0, Vrd1, and Vrd2 may be provided to a selected word line, and an unselect read voltage Vpass (not shown) may be provided to an unselected word line. The first select read voltage Vrd0 corresponds to a voltage between the erase state E and the first program state P0, the second select read voltage Vrd1 corresponds to a voltage between the first and second program states P0 and P1, and the third select read voltage Vrd2 corresponds to a voltage between the second and third program states P1 and P2.

When the first select read voltage Vrd0 is applied, a memory cell having a threshold voltage of the erase state E becomes an on cell, and a memory cell having a threshold voltage of any one program state of the first to third program states P0 to P2 becomes an off cell. When the second select read voltage Vrd1 is applied, a memory cell having a threshold voltage of the erase state E or the first program state P0 becomes an on cell, and a memory cell having a threshold voltage of any one program state of the second and third program states P1 and P2 becomes an off cells. When the select read voltage Vrd2 is applied, a memory cell having a threshold voltage of the erase state E, the first program state P0, or the second program state P1 becomes an on cell, and a memory cell having a threshold voltage of the third program state P2 becomes an off cell.

As an interval between the threshold voltage distribution and the select read voltage Vrd0, Vrd1, or Vrd2 applied during the read operation increases, a read margin is improved. Therefore, it is important to secure a distribution margin between the respective states by reducing the widths of the threshold voltage distributions corresponding to the program states P0, P1, and P2. For the MLC to store two or more-bit data per cell as well as the SLC to store one-bit data per cell, it is very important to secure a distribution margin between the respective states.

Referring to FIG. 3, the step pulse program method is used to perform a program operation of the nonvolatile memory device 100 of FIG. 1, in order to secure a distribution margin between the respective states of the memory cells. According to the step pulse program method, one pulse of program voltage is applied to a selected memory cell (i.e., Apply Program Voltage), and a verify operation (i.e., Verify) is then performed to verify whether the memory cell is programmed or not. The program voltage application operation and the verify operation form one program loop PL. When the program loop PL (i.e., PL0 and PL1 to PLk) is repeated, the program voltage increases by the increment (step voltage or step pulse).

The program verify operation is to verify whether the selected memory cell is programmed or not, through an operation of sensing how much electric charges precharged in a selected bit line are discharged after the bit line is precharged to a predetermined voltage. That is, whether the program operation is passed or failed is verified through the program verify operation. When it is determined through the program verify operation that the selected memory cell is not programmed, a program voltage increased by the increment (step voltage or step pulse) is reapplied to perform a program verify operation. The program loop PL to apply a program voltage and perform a verify operation is repeated until the memory cell is programmed to a desired level. When it is determined that the selected memory cell is a programmed cell, the channel voltage of the memory cell is increased to inhibit a program operation such that the memory cell is not influenced by the repeated program pulse.

During the program verify operation, first to third program verify voltages Vvrf0 to Vvrf2 are provided to a selected word line. The first program verify voltage Vvrf0 is a verify voltage for programming a memory cell into the first program state P0, the second program verify voltage Vvrf1 is a verify voltage for programming a memory cell into the second program state P1, and the third program verify voltage Vvrf2 is a verify voltage for programming a memory cell into the third program state P2.

Figure 4:
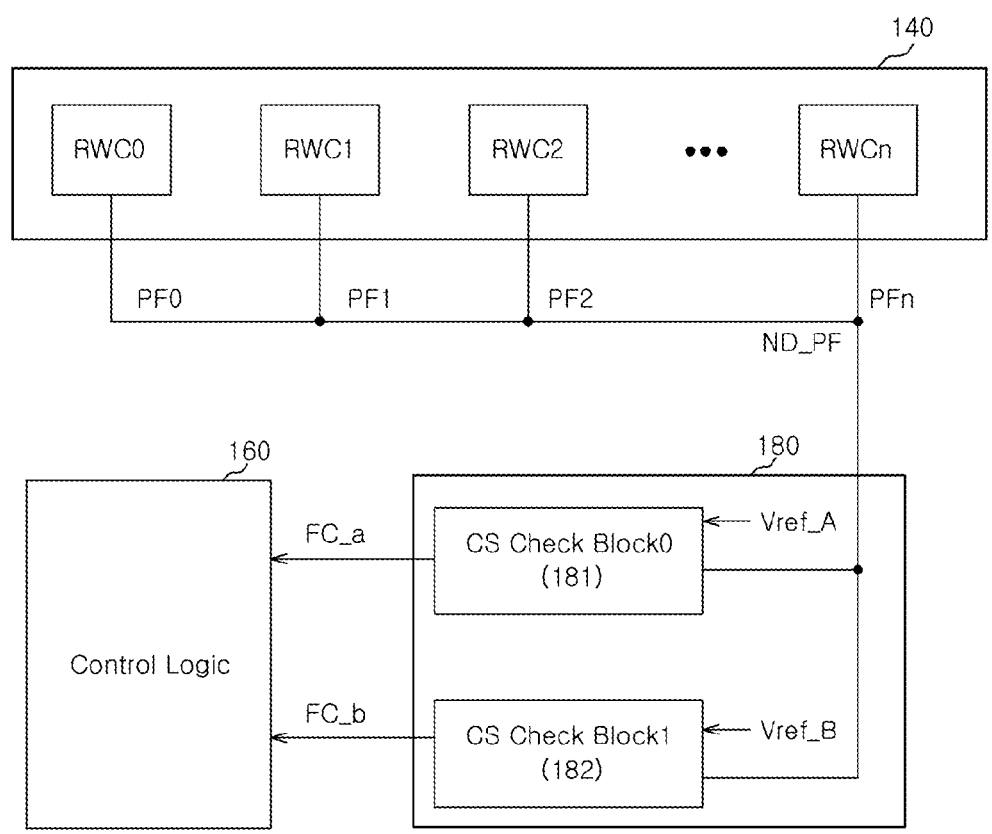
FIG. 4 is a block diagram of a current sensing check unit according to an embodiment.

FIG. 4 is a block diagram of the current sensing check unit 180 according to an embodiment. As described above, a program operation is performed according to the variable step pulse program method. Therefore, when one program loop is completed, it is determined whether the program operation is passed or failed, that is, whether the number of fail bits is larger or smaller than a reference value. The current sensing check unit 180 to perform a fail bit count operation will be described below as follows.

The current sensing check unit 180 may include a plurality of current sensing check blocks 181 and 182. Each of the current sensing check blocks 181 (i.e., CS Check Block0) and 182 (i.e., CS Check Block1) may be configured to sense the magnitude of a pass/fail signal of a program operation, provided from the data read/write circuit 140. Here, the pass/fail signal indicates a voltage value of a pass/fail sensing node ND_PF to which pass/fail signals PF0 to PFn generated from the read/write circuits RWC0 to RWCn are applied in parallel after the program operation.

The current sensing check block 181 may be configured to compare the voltage values of the pass/fail signals to a first reference voltage value Vref_A, and determine how many data read/write circuits are failed among the data read/write circuits RWC0 to RWCn, according to the comparison result. Here, the first reference voltage value Vref_A is a voltage value corresponding to the first reference value A. In other words, the current sensing check block 181 may be configured to provide information on whether the fail bit number FC_a is larger or smaller than the first reference value A, to the control logic 160.

The current sensing check block 182 (i.e., CS Check Block1) may be configured to compare the voltage values of the pass/fail signals to a second reference voltage value Vref_B, and determine how many data read/write circuits are failed among the data read/write circuits RWC0 to RWCn, according to the comparison result. Here, the second reference voltage value Vref_B is a voltage value corresponding to the second reference value B. In other words, the current sensing check block 182 may be configured to provide information on whether the fail bit number FC_b is larger or smaller than the second reference value B, to the control logic 160.

FIG. 4 illustrates the current sensing check unit 180 may include the plurality of current sensing check block 181 and 182 to perform a fail bit count operation on the plurality of reference values. However, the number of current sensing check blocks included in the current sensing check unit 180 may be changed. For example, the current sensing check unit 180 may include one or more current sensing check blocks 181. In this case, one current sensing check block 181 may repetitively perform the fail bit count operation on the plurality of reference values A and B.

Figure 5:
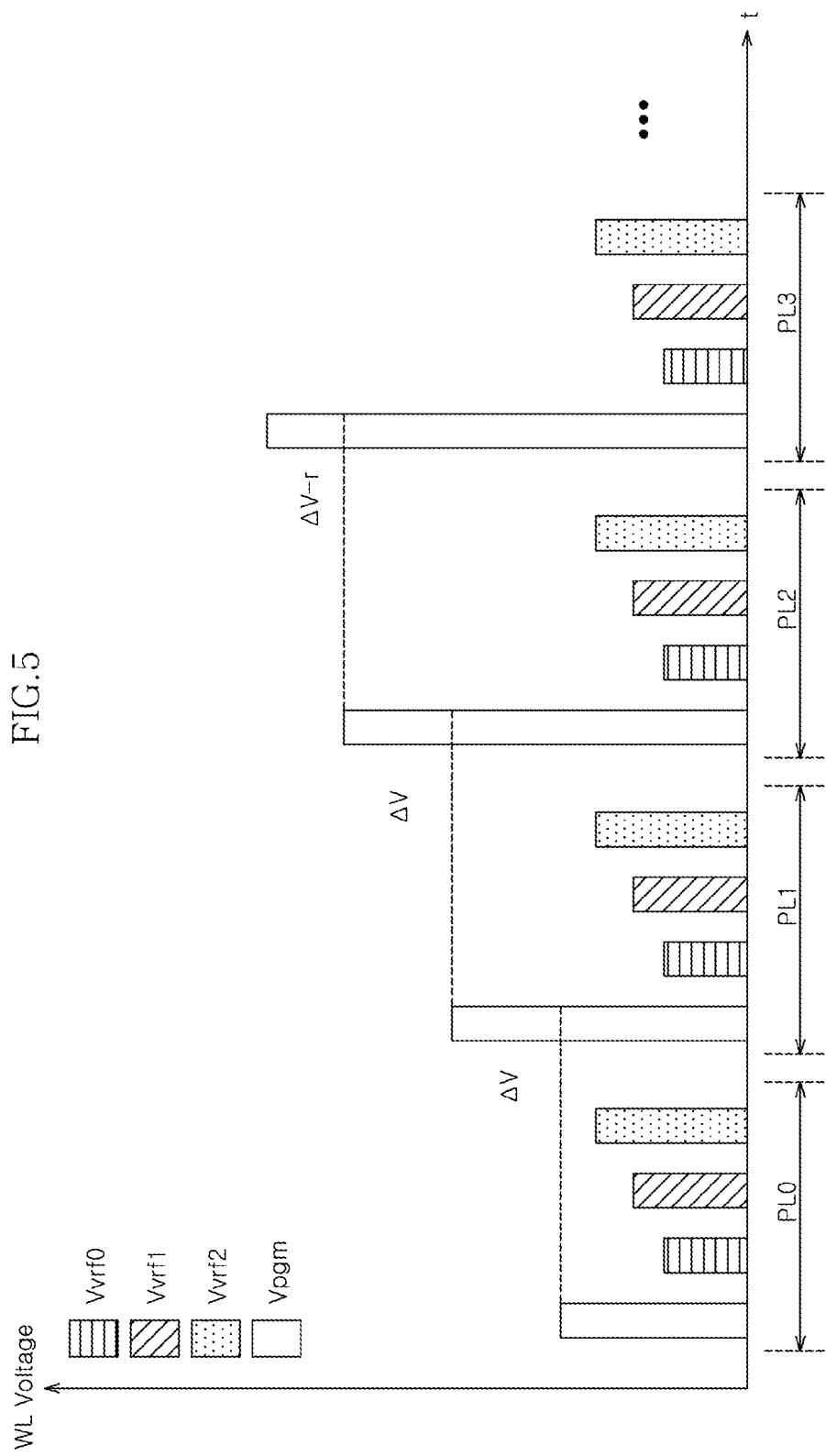
FIG. 5 is a diagram for explaining a program voltage of a variable step pulse program method of the nonvolatile memory device according to an embodiment.
Figure 6:
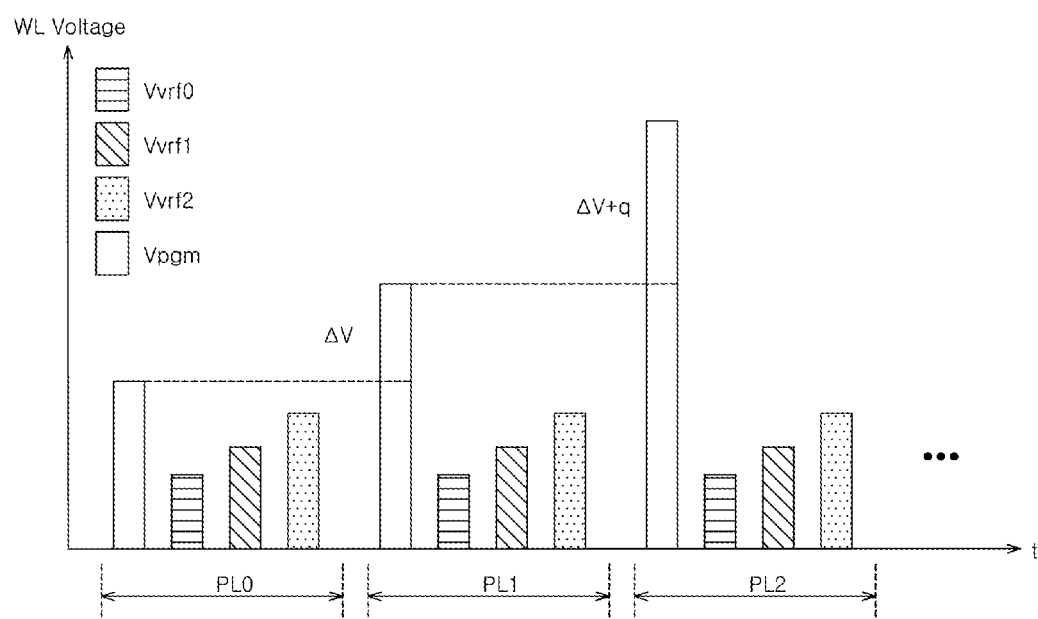
FIG. 6 is another diagram for explaining the program voltage of the variable step pulse program method of the nonvolatile memory device according to an embodiment.

FIG. 5 is a diagram for explaining the program voltage of the variable step pulse program method of the nonvolatile memory device according to an embodiment. FIG. 5 illustrates word line voltage WL Voltage on the y-axis and time t on the x-axis. FIG. 6 is another diagram for explaining the program voltage of the variable step pulse program method of the nonvolatile memory device according to an embodiment. FIG. 6 illustrates word line voltage WL Voltage on the y-axis and time t on the x-axis.

As described with reference to FIG. 4, the control logic 160 may perform the variable step pulse program method based on the fail bit numbers FC_a and FC_b provided from the current sensing check blocks 181 and 182. The control logic 160 may change the program voltage increment (step voltage or step pulse) whenever the program loop PL is repeated.

Suppose that the first reference voltage A is smaller than the second reference value B. Referring to FIGS. 2 to 5, when the fail bit number FC_a is smaller than the first reference value A, the control logic 160 controls a program voltage increment $\Delta V-r$ of a current program loop PL3 to decrease from a program voltage increment $\Delta V$ of a previous program loop PL2. When the fail bit number FC_a is smaller than the first reference value A, it means that the threshold voltage distribution of the selected memory cell approaches a target state. Therefore, when the program voltage increment is reduced to apply a program voltage, the selected memory cell may be programmed to have a dense threshold voltage distribution.

Referring to FIGS. 2 to 6, when the fail bit number FC_b is larger than the second reference value B, the control logic 160 controls a program voltage increment $\Delta V+q$ of a current program loop PL2 to increase from a program voltage increment $\Delta V$ of a previous program loop PL1. When the fail bit number FC_b is larger than the second reference value B, it means that the threshold voltage distribution of the selected memory cell does not approach a target state. Therefore, when the program voltage increment is increased to apply a program voltage, the selected memory cell may be programmed to approach a target state as fast as possible.

Additionally, the voltage variation r for reducing the program voltage increment $\Delta V$ and the voltage variation q for increasing the program voltage increment $\Delta V$ may be set to the same value or different values.

Figure 7:
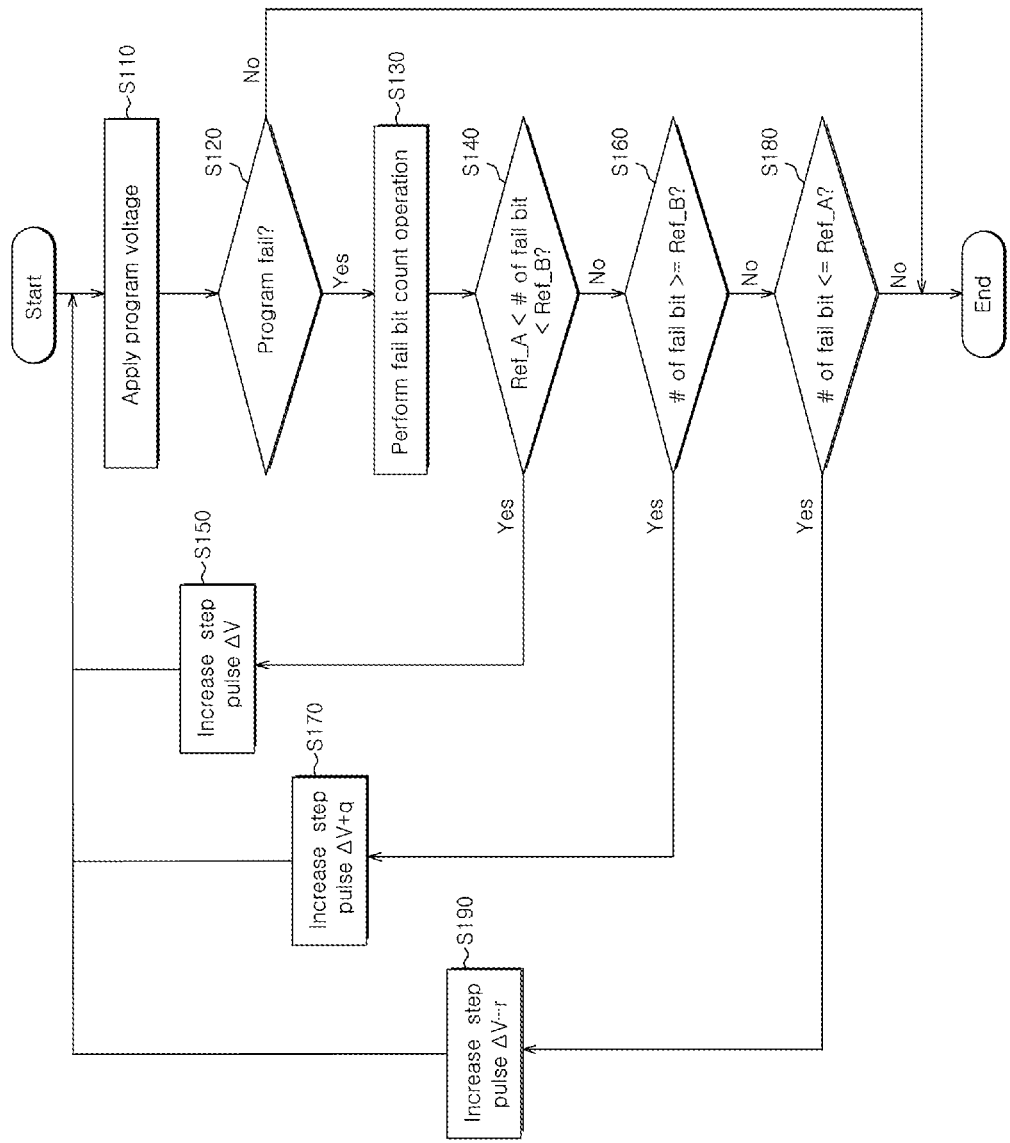
FIG. 7 is a flow chart for explaining the variable step pulse program method of the nonvolatile memory device according to an embodiment.

FIG. 7 is a flow chart for explaining the variable step pulse program method of the nonvolatile memory device according to an embodiment.

At step S110 (i.e., Apply program voltage), one pulse of program voltage is applied to a selected memory cell. At step S120 (i.e., Program fail?), a verify operation is performed to verify whether the selected memory cell is programmed or not. When it is verified that the selected memory cell is programmed into a target state (i.e., No), that is, when the program operation is passed, the program operation is ended (i.e., End). When it is verified that the selected memory cell is not programmed into a target state (i.e., Yes), that is, when the program operation is failed, the procedure proceeds to step S130.

At step S130 (i.e., Perform fail bit count operation), a fail bit count operation is performed. As described above, the fail bit count operation is performed by the current sensing check unit 180 of FIG. 1. When the fail bit number is determined as the result of the fail bit count operation, the fail bit number is compared to the reference values A and B through steps S140, S160, and S180. Furthermore, the increment $\Delta V$ of the program voltage is changed according to the comparison result.

At step S140 (i.e., Ref_A<# of fail bit<Ref_B?), whether or not the fail bit number is larger than the reference value A and smaller than the reference value B is determined. When the fail bit number corresponds to a value between the reference value A to the reference value B (i.e., Yes), the procedure proceeds to step S150. At step S150 (i.e., Increase step pulse $\Delta V$), the increment $\Delta V$ of the program voltage increases by the same amount as the increment $\Delta V$ of the previous program loop. When the fail bit number does not correspond to a value between the reference value A to the reference value B (i.e., No), the procedure proceeds to step S160.

At step S160 (i.e., # of fail bit>=Ref_B?), whether or not the fail bit number is larger than or equal to the reference value B is determined. When the fail bit number is larger than or equal to the reference value B (i.e., Yes), the procedure proceeds to step S170. At step S170 (i.e., Increase step pulse $\Delta V+q$), the increment $\Delta V+q$ of the program voltage increases more than the increment $\Delta V$ of the previous program loop. When the fail bit number is smaller than the reference value B (i.e., No), the procedure proceeds to step S180.

At step S180 (i.e., # of fail bit<=Ref_A?), whether the fail bit number is smaller than or equal to the reference value A is determined. When the fail bit number is smaller than or equal to the reference value A (i.e., Yes), the procedure proceeds to step S190. At step s190 (i.e., Increase step pulse $\Delta V-r$), the increment $\Delta V-r$ of the program voltage increases less than the increment $\Delta V$ of the previous program loop. However, the program voltage applied during the current program loop is higher than the program voltage applied during the previous program loop. When the fail bit number is greater than the reference value A (i.e., No), the procedure ends (i.e., End).

Figure 8:
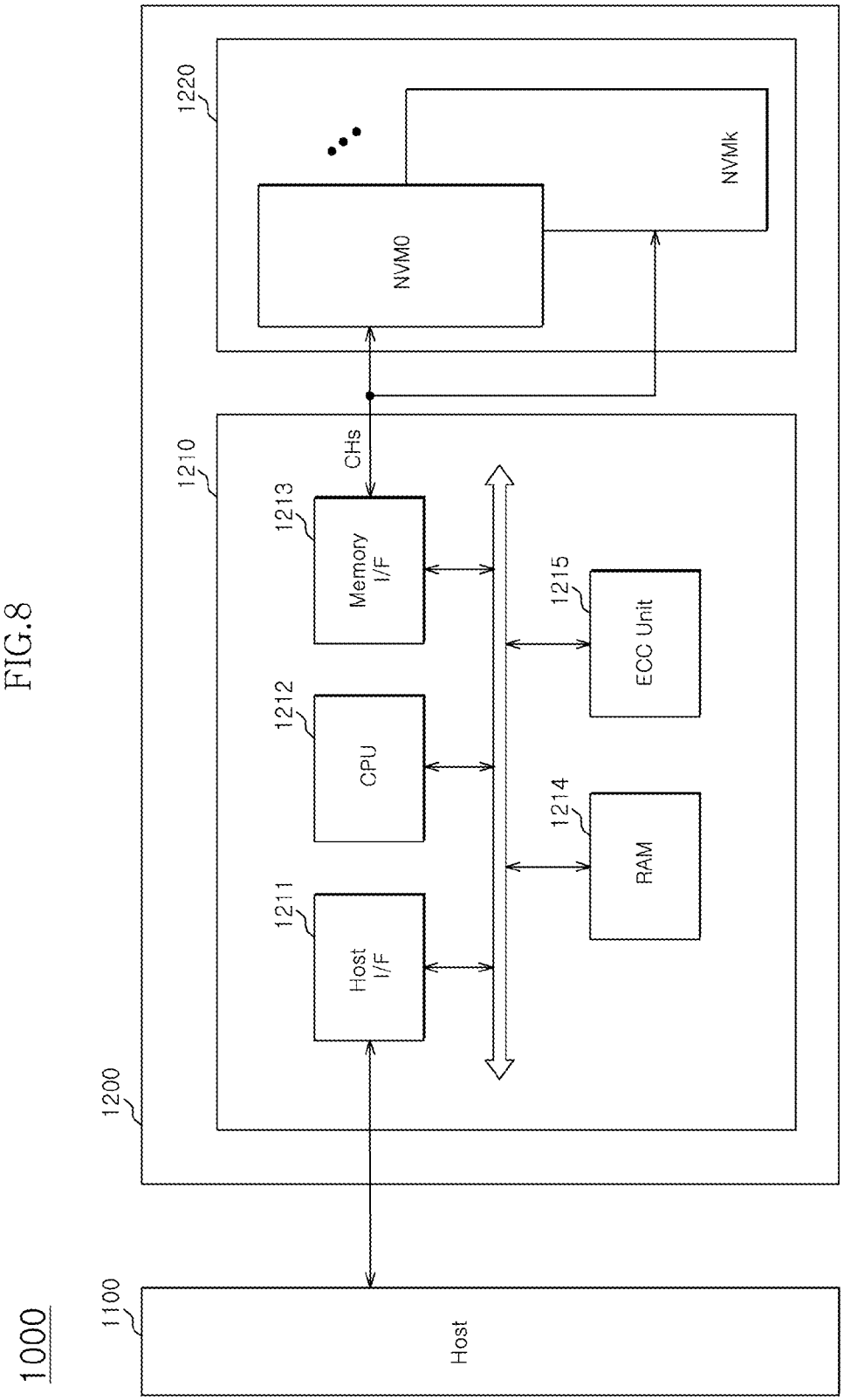
FIG. 8 is a block diagram illustrating a data processing system including the nonvolatile memory device according to an embodiment.

FIG. 8 is a block diagram illustrating a data processing system including the nonvolatile memory device according to an embodiment. Referring to FIG. 8, the data processing system 1000 may include a host 1100 and a data storage device 1200. The data storage device 1200 may include a controller 1210 and a data storage medium 1220. The data storage device 1200 may be connected to the host 1100 such as a desktop computer, a notebook computer, a digital camera, a mobile phone, an MP3 player, a game machine or the like. The data storage device 1200 is also referred to as a memory system.

The controller 1210 is coupled to the host 1100 and the data storage medium 1220. The controller 1210 may be configured to access the data storage medium 1220 in response to a request from the host 1100. For example, the controller 1210 may be configured to control a read, program, or erase operation of the data storage medium 1220. The controller 1210 may be configured to drive firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 may be configured to control overall operations of the controller 1210 in response to a request of the host. The RAM 1214 may be used as a working memory of the CPU 1212. The RAM 1214 may temporarily store data read from the data storage medium 1220 or data provided from the host 1100.

The host interface 1211 may be configured to interface the host 1100 and the controller 1210. For example, the host interface 1211 may be configured to communicate with the host 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 may be configured to interface the controller 1210 and the data storage medium 1220. The memory interface 1213 may be configured to provide a command and an address to the data storage medium 1220. Furthermore, the memory interface 1213 may be configured to exchange data with the data storage medium 1220.

The data storage medium 1220 may be configured with the nonvolatile memory device 100 of FIG. 1 according to an embodiment. The data storage medium 1220 may include a plurality of nonvolatile memory devices NVM0 to NVMk. As the data storage medium 1220 may be configured with the nonvolatile memory device 100 according to the embodiment, the operating speed of the data storage device 1200 may be increased.

The ECC unit 1215 may be configured to detect an error of the data read from the data storage medium 1220. Furthermore, the ECC unit 1215 may be configured to correct the detected error, when the detected error falls within a correction range. Meanwhile, the ECC unit 1215 may be provided inside or outside the controller 1210 depending on the memory system 1000.

The controller 1210 and the data storage medium 1220 may be integrated to form a solid state drive (SSD).

As another example, the controller 1210 and the data storage medium 1220 may be integrated into one semiconductor device to form a memory card. For example, the controller 1210 and the data storage medium 1220 may be integrated into one semiconductor device to form a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted in various types of packages. For example, the controller 1210 or the data storage medium 1220 may be packaged and mounted according to various methods such as POP (package on package), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 9:
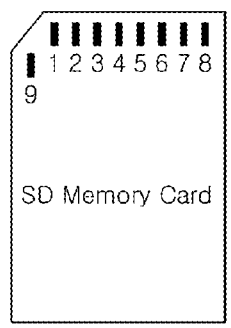
FIG. 9 illustrates a memory card including the nonvolatile memory device according to an embodiment.

FIG. 9 illustrates a memory card including the nonvolatile memory device according to an embodiment. FIG. 9 illustrates the exterior of an SD (secure digital) card among memory cards.

Referring to FIG. 9, the SD card may include one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transferred. In general, the command is transmitted to the SD card from a host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, form a pair to transmit differential signals.

The SD card may include the nonvolatile memory device 100 of FIG. 1 according to an embodiment and a controller for controlling the nonvolatile memory device. The controller included in the SD card may have the same configuration and function as the controller 1210 described with reference to FIG. 6.

Figure 10:
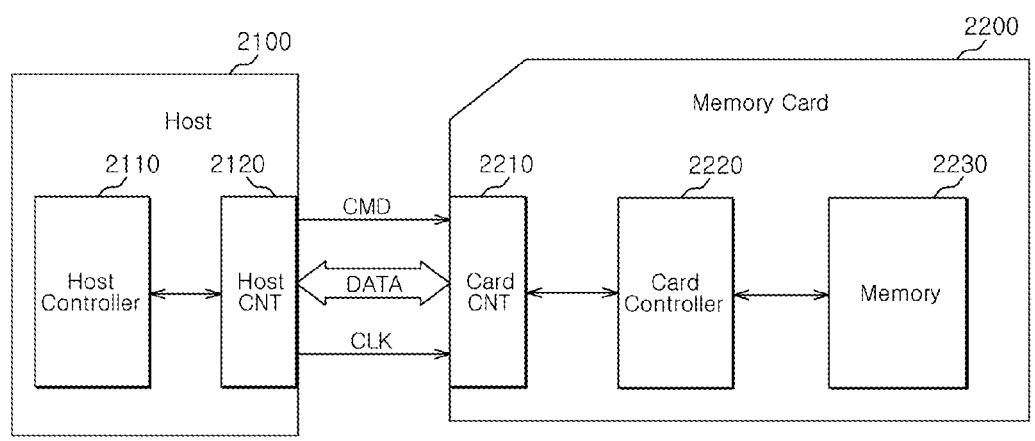
FIG. 10 is a block diagram illustrating the internal configuration of the memory card illustrated in FIG. 9 and the connection relation between the memory card and a host.

FIG. 10 is a block diagram illustrating the internal configuration of the memory card illustrated in FIG. 9 and the connection relation between the memory card and a host. Referring to FIG. 10, the data processing system 2000 may include a host 2100 and a memory card 2200. The host 2100 may include a host controller 2110 and a host connection unit 2120. The memory card 2200 may include a card connection unit 2210, a card controller 2220, and a memory device 2230.

The host connection unit 2120 and the card connection unit 2210 may include a plurality of pins. The pins may include a command pin, a clock pin, a data pin, and a power supply pin. The number of pins may differ depending on the type of the memory card 2200.

The host 2100 may store data in the memory card 2200 or reads data stored in the memory card 2200.

The host controller 2110 may transmit a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 may transmit a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 11:
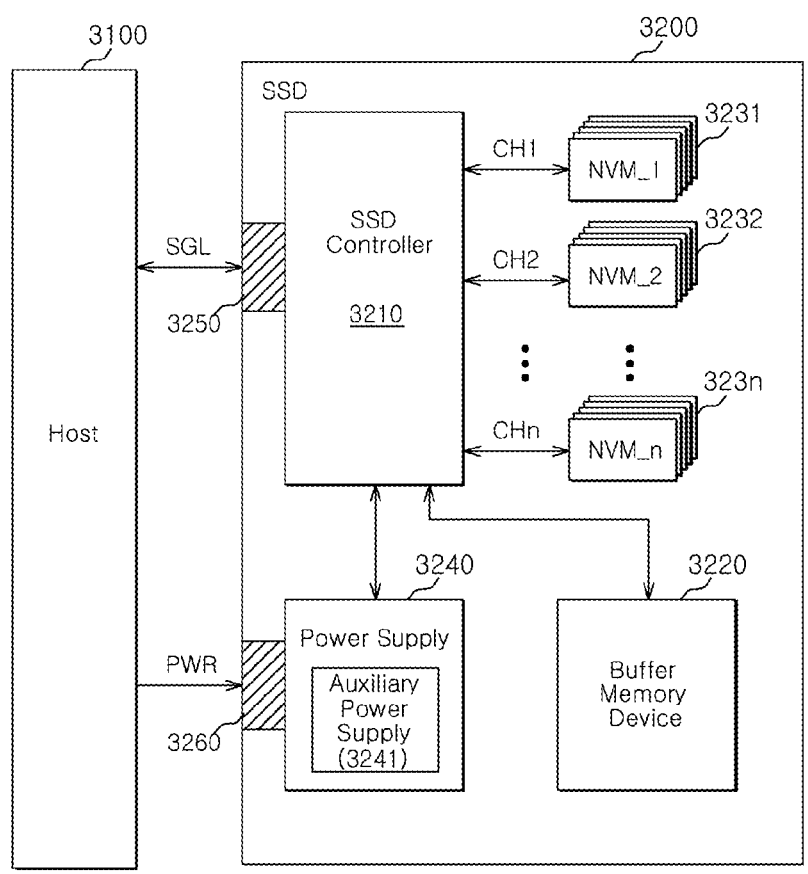
FIG. 11 is a block diagram illustrating an SSD including the nonvolatile memory device according to an embodiment.

FIG. 11 is a block diagram illustrating an SSD including the nonvolatile memory device according to an embodiment. Referring to FIG. 11, a data processing system 3000 may include a host 3100 and an SSD 3200.

The SSD 3200 may include an SSD controller 3210, a buffer memory device 3220, a plurality of nonvolatile memory devices 3231 to 323n, a power supply 3240, a signal connector 3250, and a power connector 3260.

The SSD 3200 operates in response to a request of the host device 3100. That is, the SSD controller 3210 may be configured to access the nonvolatile memory devices 3231 to 323n in response to a request from the host 3100. For example, the SSD controller 3210 may be configured to control read, program, and erase operations of the nonvolatile memory devices 3231 to 323n.

The buffer memory device 3220 may be configured to temporarily store data which are to be stored in the nonvolatile memory devices 3231 to 323n. Furthermore, the buffer memory device 3220 may be configured to temporarily store data read from the nonvolatile memory devices 3231 to 323n. The data temporarily stored in the buffer memory device 3220 are transmitted to the host 3100 or the nonvolatile memory devices 3231 to 323n, according to the control of the SSD controller 3210.

The nonvolatile memory devices 3231 to 323n may be used as storage media of the SSD 3200. Each of the nonvolatile memory devices 3231 to 323n may include the nonvolatile memory device 100 of FIG. 1 according to an embodiment. Therefore, the operating speed of the SSD 3200 may be increased.

The respective nonvolatile memory devices 3231 to 323n may be connected to the SSD controller 3210 through a plurality of channels CH1 to CHn. One channel may be connected to one or more nonvolatile memory devices. The nonvolatile memory devices connected to one channel may be connected to the same signal bus and data bus.

The power supply 3240 may be configured to provide power PWR inputted through the power connector 3260 into the SSD 3200. The power supply 3240 may include an auxiliary power supply 3241. The auxiliary power supply 3241 may be configured to supply power to normally terminate the SSD 3200, when sudden power off occurs. The auxiliary power supply 3241 may include super capacitors capable of storing the power PWR.

The SSD controller 3210 may be configured to exchange signals SGL with the host 3100 through the signal connector 3250. Here, the signals SGL may include commands, addresses, data and the like. The signal connector 3250 may include a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 12:
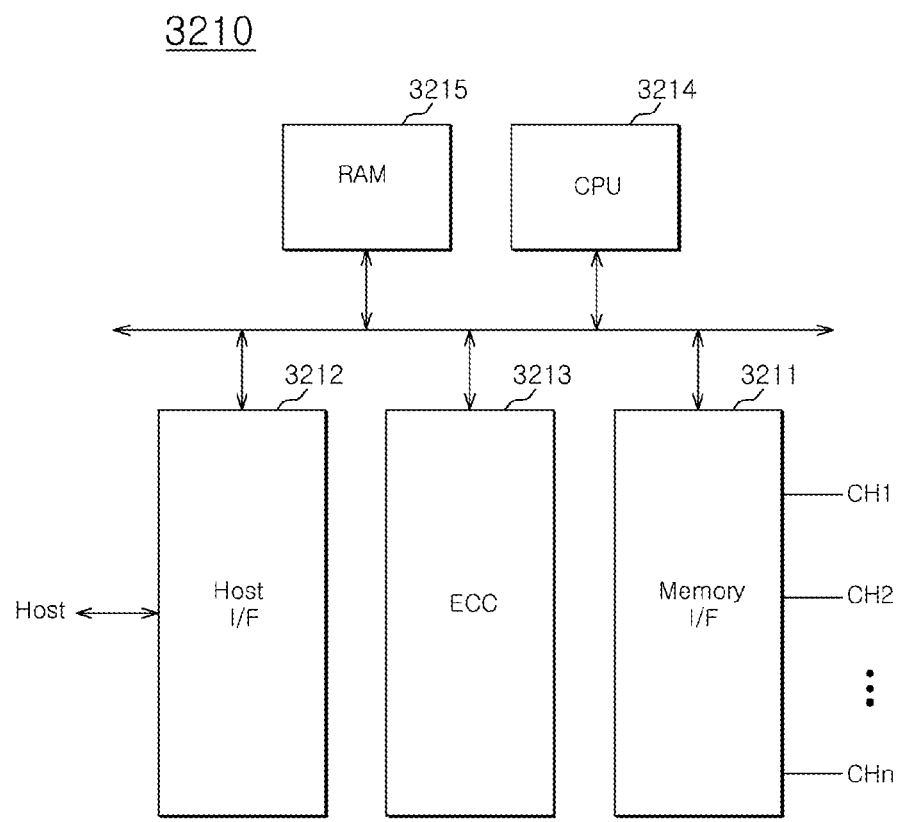
FIG. 12 is a block diagram illustrating the SSD controller illustrated in FIG. 11.

FIG. 12 is a block diagram illustrating the SSD controller illustrated in FIG. 11. Referring to FIG. 10, the SSD controller 3210 may include a memory interface 3211, a host interface 3212, an ECC unit 3213, a CPU 3214, and a RAM 3215.

The memory interface 3211 may be configured to provide a command and an address to the nonvolatile memory devices 3231 to 323n. Furthermore, the memory interface 3211 may be configured to exchange data with the nonvolatile memory devices 3231 to 323n. The memory interface 3211 may scatter data transferred from the buffer memory device 3220 over the respective channels CH1 to CHn, according to the control of the CPU 3214. Furthermore, the memory interface 3211 transfers data read from the nonvolatile memory devices 3231 to 323n to the buffer memory device 3220, according to the control of the CPU 3214.

The host interface 3212 may be configured to provide an interface with the SSD 3200 in response to the protocol of the host 3100. For example, the host interface 3212 may be configured to communicate with the host 3100 through one of PATA (Parallel Advanced Technology Attachment), SATA (Serial Advanced Technology Attachment), SCSI (Small Computer System Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 may be configured to generate parity bits based on the data transmitted to the nonvolatile memory devices 3231 to 323n. The generated parity bits may be stored in spare areas of the nonvolatile memory devices 3231 to 323n. The ECC unit 3213 may be configured to detect an error of data read from the nonvolatile memory devices 3231 to 323n. When the detected error falls within a correction range, the ECC unit 3213 may correct the detected error.

The CPU 3214 may be configured to analyze and process a signal SGL inputted from the host 3100. The CPU 3214 controls overall operations of the SSD controller 3210 in response to a request of the host 3100. The CPU 3214 controls the operations of the buffer memory device 3220 and the nonvolatile memory devices 3231 to 323n according to firmware for driving the SSD 3200. The RAM 3215 is used as a working memory device for driving the firmware.

Figure 13:
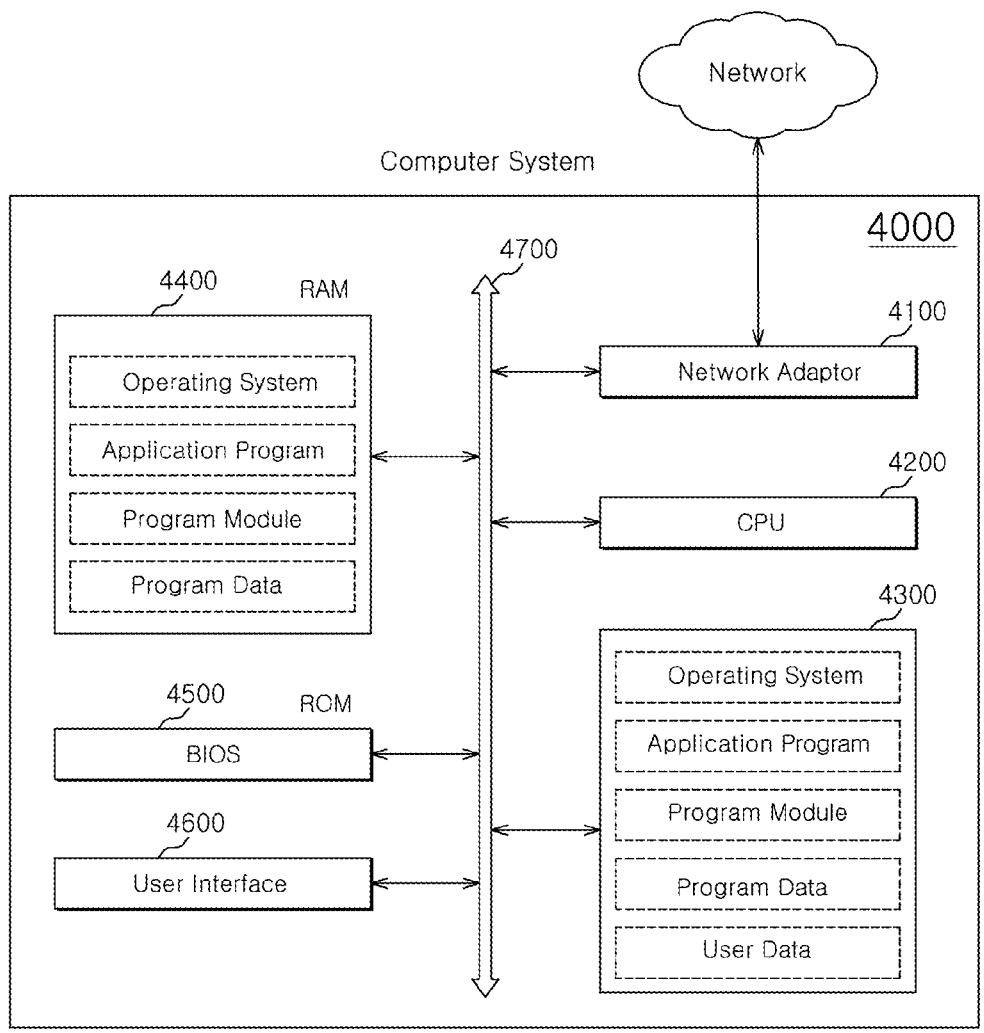
FIG. 13 is a block diagram illustrating a computer system in which a data storage device having the nonvolatile memory device according to an embodiment is mounted.

FIG. 13 is a block diagram illustrating a computer system in which a data storage device having the nonvolatile memory device according to an embodiment is mounted. Referring to FIG. 11, the computer system 4000 may include a network adapter 4100, a CPU 4200, a data storage device 4300, a RAM 4400, a ROM 4500, and a user interface 4600, which are electrically connected to the system bus 4700. Here, the data storage device 4300 may include the data storage device 1200 illustrated in FIG. 8 or the SSD 3200 illustrated in FIG. 11.

The network adapter 4100 may be configured to provide an interface between the computer system 4000 and external networks. The CPU 4200 may be configured to perform overall arithmetic operations for driving an operating system or application programs staying in the RAM 4400.

The data storage device 4300 may be configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

While various embodiments have been described above, it will be understood to those skilled in the art that the embodiments described are by way of example only. Accordingly, the nonvolatile memory device described herein should not be limited based on the described embodiments.

What is claimed is:

1. A nonvolatile memory device comprising:
a plurality of memory cells arranged at a region where a word line and a bit line cross each other;
a voltage generator configured to generate a program voltage to apply to the word line by increasing the program voltage by an increment whenever a program loop is repeated;
a current sensing check unit configured to compare a number of failed memory cells among the memory cells to first and second reference values; and
a control logic configured to control the voltage generator to change the increment according to the comparison result of the current sensing check unit.

2. The nonvolatile memory device according to claim 1, wherein, when the number of failed memory cells is larger than the first reference value and smaller than the second reference value, the control logic performs a control to apply a program voltage, which is increased by the same increment as the increment of a previous program loop, to the word line.

3. The nonvolatile memory device according to claim 1, wherein, when the number of failed memory cells is smaller than or equal to the first reference value, the control logic performs a control to apply a program voltage, which is increased by a smaller increment than the increment of a previous loop, to the word line.

4. The nonvolatile memory device according to claim 1, wherein, when the number of failed memory cells is larger than or equal to the second reference value, the control logic performs a control to apply a program voltage, which is increased by a larger increment than the increment of a previous loop, to the word line.

5. The nonvolatile memory device according to claim 1, wherein the current sensing check unit performs a first fail bit count operation to compare the number of failed memory cells to the first reference value and a second fail bit count operation to compare the number of failed memory cells to the second reference value.

6. The nonvolatile memory device according to claim 5, wherein the current sensing check unit comprises:
a first current sensing check block configured to perform the first fail bit count operation; and
a second current sensing check block configured to perform the second fail bit count operation.

7. The nonvolatile memory device according to claim 5, wherein the current sensing check unit comprises a single current sensing check block configured to repetitively perform the first fail bit count operation and the second fail bit count operation.

8. The nonvolatile memory device according to claim 1, wherein the first reference value is smaller than the second reference value.

9. An operating method of a nonvolatile memory device, comprising the steps of:
primarily applying a first program voltage, which is increased by an increment from a program voltage applied during a previous program loop, to memory cells;
when one or more of the memory cells receiving the program voltage are failed, comparing a number of failed memory cells to first and second reference values, respectively;
generating a second program voltage by changing the increment based on the comparison result; and
secondarily applying the second program voltage to the memory cells.

10. The operating method according to claim 9, wherein the step of secondarily applying the second program voltage comprises applying the second program voltage, which is increased by the same increment as the increment of the first program voltage applied at the step of primarily applying the first program voltage, when the number of failed memory cells is larger than the first reference value and smaller than the second reference value.

11. The operating method according to claim 9, wherein the step of secondarily applying the second program voltage comprises applying the second program voltage, which is increased by a smaller increment than the increment of the first program voltage applied at the step of primarily applying the first program voltage, when the number of failed memory cells is smaller than or equal to the first reference value.

12. The operating method according to claim 9, wherein the step of secondarily applying the second program voltage comprises applying the second program voltage, which is increased by a larger increment than the increment of the first program voltage applied at the step of primarily applying the first program voltage, when the number of failed memory cells is larger than or equal to the second reference value.

13. The operating method according to claim 9, wherein the step of comparing a number of failed memory cells to first and second reference values, respectively, comprises performing a first fail bit count operation to compare the number of failed memory cells to the first reference value, and performing a second fail bit operation to compare the number of failed memory cells to the second reference value.

14. The operating method according to claim 9, wherein the first reference value is smaller than the second reference value.

15. A data storage device comprising:
a nonvolatile memory device; and
a controller configured to control the nonvolatile memory device,
wherein the nonvolatile memory device comprises:
a plurality of memory cells arranged at a region where a word line and a bit line cross each other;
a voltage generator configured to generate a program voltage to apply to the word lines by increasing the program voltage by an increment whenever a program loop is repeated;
a current sensing check unit configured to compare a number of failed memory cells among the memory cells to first and second reference values; and
a control logic configured to control the voltage generator to change the increment according to the comparison result of the current sensing check unit.

16. The data storage device according to claim 15, wherein, when the number of failed memory cells is larger than the first reference value and smaller than the second reference value, the control logic performs a control to apply a program voltage, which is increased by the same increment as the increment of a previous program loop, to the word line.

17. The data storage device according to claim 15, wherein, when the number of failed memory cells is smaller than or equal to the first reference value, the control logic performs a control to apply a program voltage, which is increased by a smaller increment than the increment of a previous loop, to the word line.

18. The data storage device according to claim 15, wherein, when the number of failed memory cells is larger than or equal to the second reference value, the control logic performs a control to apply a program voltage, which is increased by a larger increment than the increment of a previous loop, to the word line.

19. The nonvolatile memory device according to claim 15, wherein the current sensing check unit performs a first fail bit count operation to compare the number of failed memory cells to the first reference value and a second fail bit count operation to compare the number of failed memory cells to the second reference value.

20. The nonvolatile memory device according to claim 19, wherein the current sensing check unit comprises:
   a first current sensing check block configured to perform the first fail bit count operation; and
   a second current sensing check block configured to perform the second fail bit count operation.

21. The nonvolatile memory device according to claim 19, wherein the current sensing check unit comprises a single current sensing check block configured to repetitively perform the first fail bit count operation and the second fail bit count operation.

22. The nonvolatile memory device according to claim 15, wherein the nonvolatile memory device and the controller are configured as a memory card.

23. The nonvolatile memory device according to claim 15, wherein the nonvolatile memory device and the controller are configured as a solid state drive (SSD).

* * * * *